(12) United States Patent
Sung et al.

(10) Patent No.: US 10,950,419 B2
(45) Date of Patent: Mar. 16, 2021

(54) SHROUDS AND SUBSTRATE TREATING SYSTEMS INCLUDING THE SAME

(71) Applicant: Samsung Electronics Co., Ltd., Suwon-si (KR)

(72) Inventors: Edward Sung, Hwaseong-si (KR); Hyuk Kim, Seongnam-si (KR); Daehyun Jang, Hwaseong-si (KR); Sung Il Cho, Seoul (KR)

(73) Assignee: Samsung Electronics Co., Ltd.

( * ) Notice: Subject to any disclaimer, the term of this patent is extended or adjusted under 35 U.S.C. 154(b) by 169 days.

(21) Appl. No.: 15/945,001

(22) Filed: Apr. 4, 2018

(65) Prior Publication Data

US 2019/0066983 A1 Feb. 28, 2019

(30) Foreign Application Priority Data

Aug. 22, 2017 (KR) .......................... 10-2017-0106198

(51) Int. Cl.
*H01J 37/32* (2006.01)
*H01L 21/67* (2006.01)
*H01L 21/683* (2006.01)

(52) U.S. Cl.
CPC .. *H01J 37/32651* (2013.01); *H01J 37/32715* (2013.01); *H01L 21/6719* (2013.01); *H01L 21/67069* (2013.01); *H01L 21/6831* (2013.01); *H01L 21/6833* (2013.01); *H01J 37/32091* (2013.01); *H01J 2237/334* (2013.01)

(58) Field of Classification Search
USPC .............. 118/715–733, 723 ER; 315/111.71; 156/345.43–345.47
See application file for complete search history.

(56) References Cited

U.S. PATENT DOCUMENTS

| 6,506,685 B2 | 1/2003 | Li et al. |
| 7,987,814 B2 | 8/2011 | Carducci et al. |
| 8,540,844 B2 | 9/2013 | Hudson et al. |
| 8,900,398 B2 | 12/2014 | Dhindsa et al. |
| 9,123,661 B2 | 9/2015 | Kellogg |

(Continued)

FOREIGN PATENT DOCUMENTS

| KR | 20100135894 | 12/2010 |
| KR | 20120068847 | 6/2012 |

(Continued)

*Primary Examiner* — Rakesh K Dhingra
(74) *Attorney, Agent, or Firm* — Myers Bigel, P.A.

(57) ABSTRACT

Shrouds and substrate treating systems including the same are provided. Substrate treating systems may include a process chamber, a supporter, and a plasma source that is spaced apart from the supporter in a vertical direction. The substrate treating systems may also include a shroud configured to contain the plasma therein. The shroud may include a sidewall portion and a first flange portion extending horizontally from the sidewall portion and including a plurality of first slits that extend through a thickness of the first flange portion. The first flange portion may define a first opening, and a portion of the supporter may extend through the first opening. The sidewall portion may include a plurality of second slits, and each of the plurality of second slits may extend through a thickness of the sidewall portion and may extend from one of the plurality of first slits toward the plasma source.

20 Claims, 14 Drawing Sheets

(56) References Cited

U.S. PATENT DOCUMENTS

| | | | |
|---|---|---|---|
| 2002/0170881 A1* | 11/2002 | Benzing | H01J 37/3244 216/67 |
| 2004/0206309 A1* | 10/2004 | Bera | H01J 37/321 118/728 |
| 2005/0241765 A1* | 11/2005 | Dhindsa | H01J 37/3244 156/345.34 |
| 2006/0042754 A1* | 3/2006 | Yoshida | H01J 37/32091 156/345.1 |
| 2006/0151114 A1* | 7/2006 | Fink | H01J 37/3244 156/345.29 |
| 2007/0289710 A1* | 12/2007 | Hudson | B08B 7/0035 156/345.38 |
| 2011/0108524 A1* | 5/2011 | Dhindsa | H01J 37/32623 216/59 |
| 2015/0044873 A1* | 2/2015 | Kellogg | H01J 9/00 438/694 |
| 2015/0060404 A1* | 3/2015 | Dhindsa | H01J 37/32082 216/61 |
| 2016/0260582 A1 | 9/2016 | Hosaka et al. | |

FOREIGN PATENT DOCUMENTS

| | | |
|---|---|---|
| KR | 20150017689 | 2/2015 |
| KR | 20150076800 | 7/2015 |
| KR | 20160108162 | 9/2016 |

\* cited by examiner

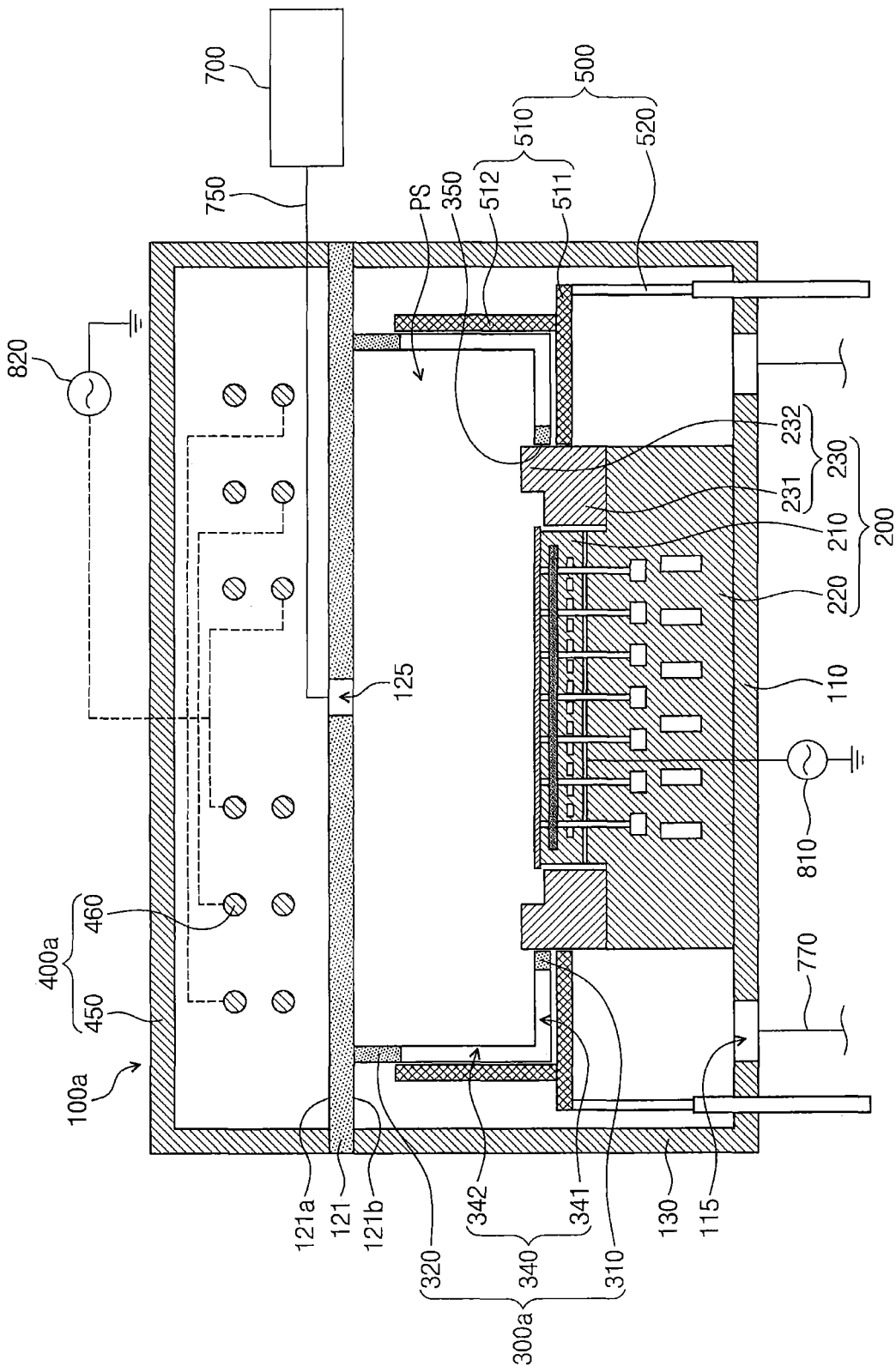

SHROUDS AND SUBSTRATE TREATING SYSTEMS INCLUDING THE SAME

CROSS-REFERENCE TO RELATED APPLICATION

This U.S. non-provisional patent application claims priority under 35 U.S.C. § 119 to Korean Patent Application No. 10-2017-0106198, filed on Aug. 22, 2017, in the Korean Intellectual Property Office, the disclosure of which is hereby incorporated by reference in its entirety.

BACKGROUND

The present disclosure relates to a shroud and a substrate treating system including the same.

Due to their small-size, multifunction, and/or low-price, semiconductor devices are important elements in the electronics industry. Semiconductor devices are fabricated using a variety of unit processes, such as deposition, ion-implantation, photolithography, and etching processes. Some of the unit processes may be performed using plasma produced using a process gas.

SUMMARY

Some embodiments of the inventive concept provide a shroud unit, which is configured to quickly exhaust by-products from an internal space therein, and a substrate treating system including the same.

According to some embodiments of the inventive concept, a substrate treating system may include a process chamber, a supporter that is in the process chamber and is configured to support a substrate, and a plasma source that is in the process chamber above the supporter and is configured to produce plasma in the process chamber using a process gas. The plasma source may be spaced apart from the supporter in a vertical direction. The substrate treating system may also include a shroud that is in the process chamber between the supporter and the plasma source. The shroud may be configured to contain the plasma therein. The shroud may include a sidewall portion facing a sidewall of the process chamber and a first flange portion extending horizontally from the sidewall portion and including a plurality of first slits that extend through a thickness of the first flange portion. The first flange portion may define a first opening, and a portion of the supporter may extend through the first opening. The sidewall portion may include a plurality of second slits, and each of the plurality of second slits may extend through a thickness of the sidewall portion and may extend from one of the plurality of first slits toward the plasma source.

According to some embodiments of the inventive concept, a substrate treating system using plasma may include a process chamber including a bottom wall, a top wall that is spaced apart from the bottom wall in a vertical direction, and a sidewall connected to the bottom wall and the top wall. The substrate treating system may also include a shroud that is in the process chamber and is configured to contain a plasma therein. The shroud may include a sidewall portion facing the sidewall of the process chamber and having a cylinder shape, a first flange portion extending from the sidewall portion of the shroud and facing the bottom wall of the process chamber, and a plurality of exhaust holes. Each of the plurality of exhaust holes may extend from the sidewall portion to the first flange portion.

According to some embodiments of the inventive concept, a shroud configured to provide a space for plasma in a process chamber may include a sidewall portion having a cylinder shape and a first flange portion having a ring shape. The first flange portion may extend from the sidewall portion. The sidewall portion may include opposing ends that are spaced apart from each other in a vertical direction, and the first flange portion may be adjacent a first end of the opposing ends of the sidewall portion. The first flange portion may include a plurality of first slits, and each of the plurality of first slits may extend through a thickness of the first flange portion and extend radially. The sidewall portion may include a plurality of second slits, and each of the plurality of second slits may extend through a thickness of the sidewall portion and may extend from one of the plurality of first slits toward a second end of the opposing ends of the sidewall portion.

BRIEF DESCRIPTION OF THE DRAWINGS

Example embodiments will be more clearly understood from the following description taken in conjunction with the accompanying drawings. The accompanying drawings represent non-limiting, example embodiments as described herein.

FIGS. 9 and 10 illustrate a substrate treating system according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of regions and/or elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown. As used herein the term "and/or" includes any and all combinations of one or more of the associated listed items.

Figure 1:
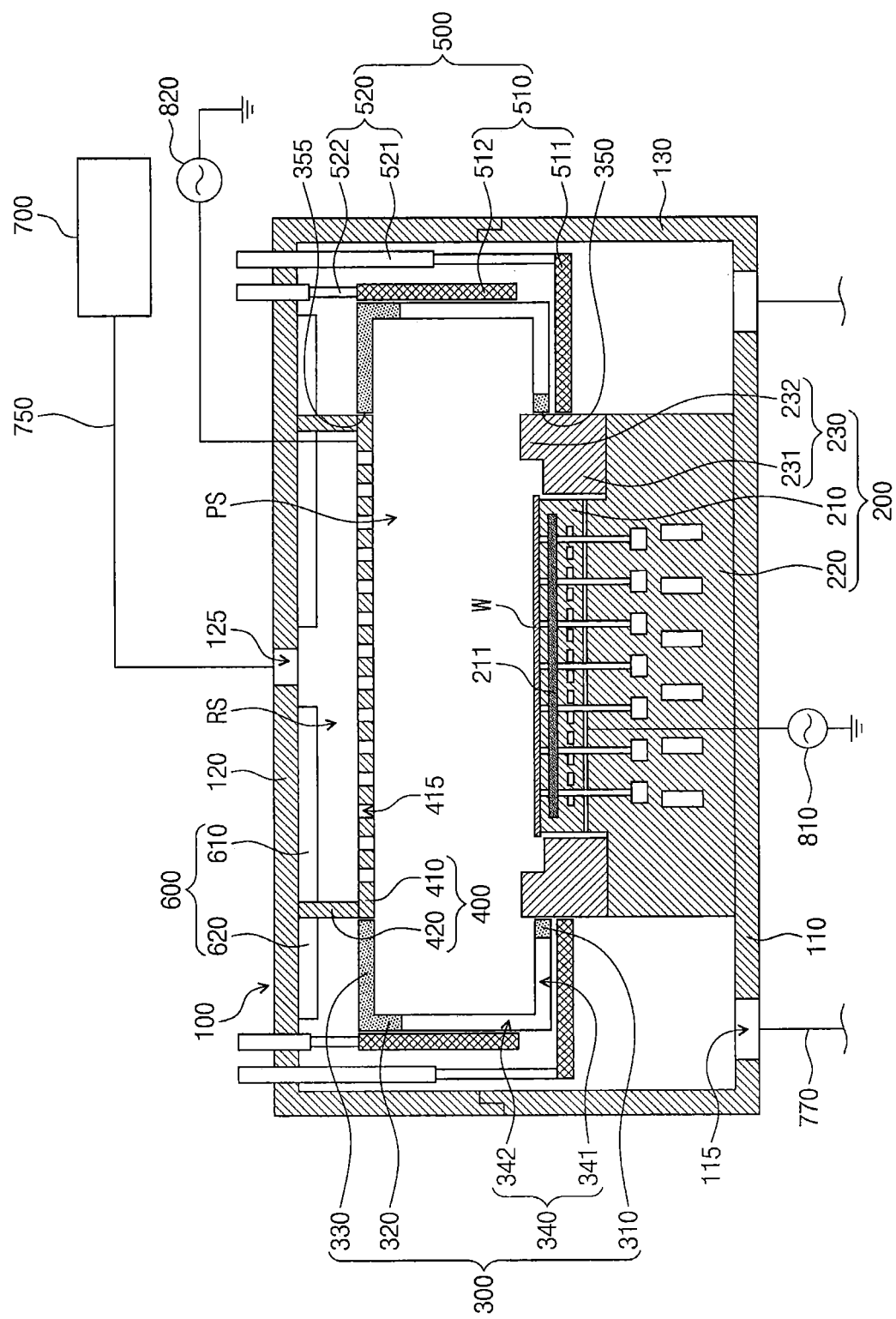
FIG. 1 illustrates a substrate treating system according to some embodiments of the inventive concept.
Figure 2:
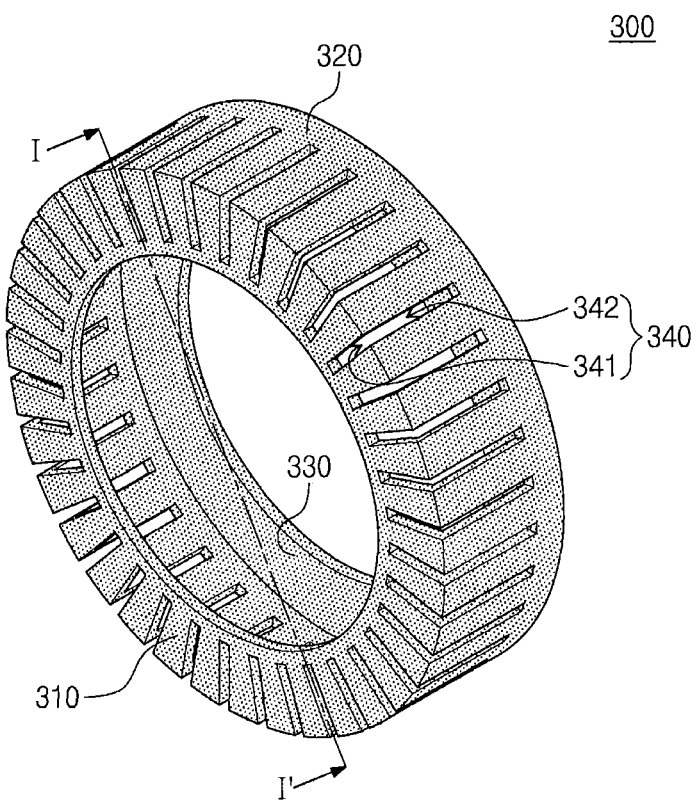
FIG. 2 is a perspective view of the shroud unit of FIG. 1.
Figure 3:
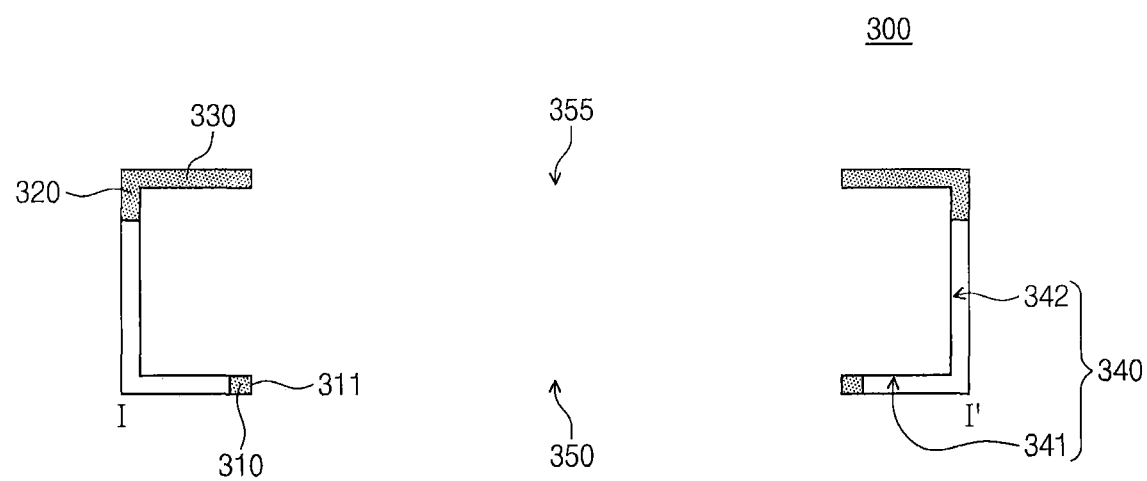
FIG. 3 is a cross-sectional view of the shroud unit taken along the line I-I' of FIG. 2.
Figure 4:
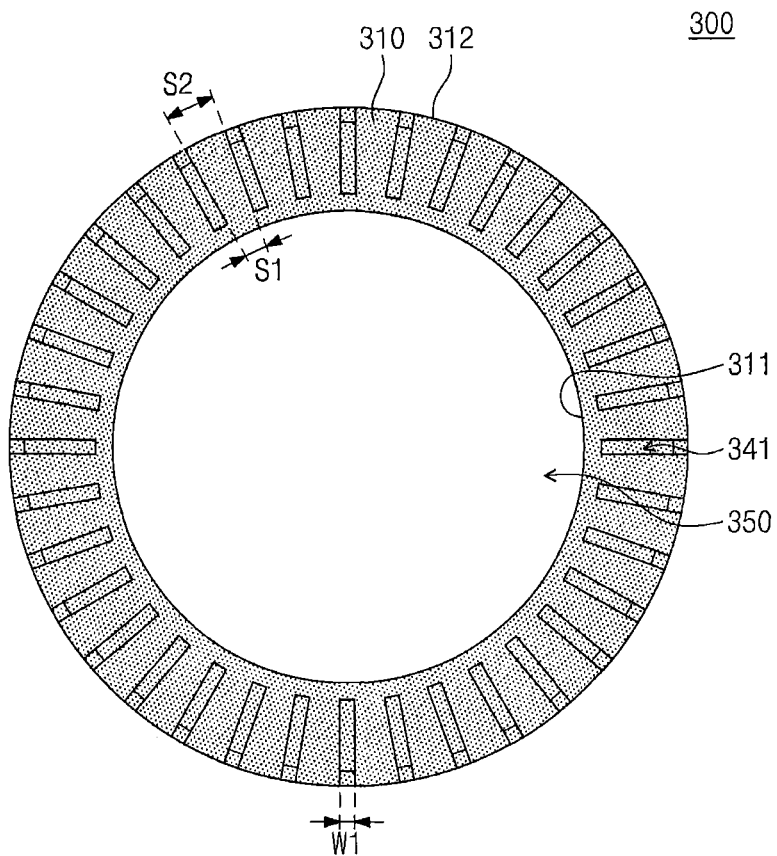
FIG. 4 is a bottom plan view of the shroud unit of FIG. 2.
Figure 5:
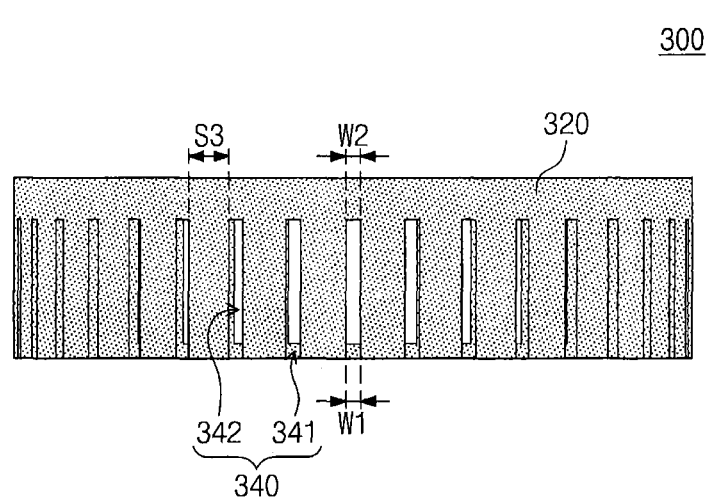
FIG. 5 is a side view of the shroud unit of FIG. 2.
Figure 6:
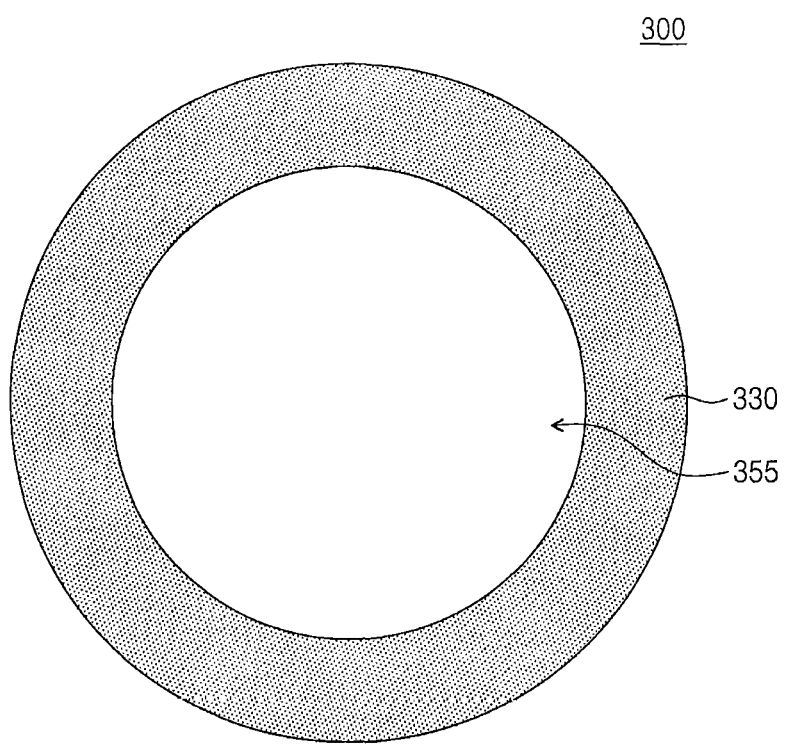
FIG. 6 is a plan view of the shroud unit of FIG. 2.

FIG. 1 illustrates a substrate treating system according to some embodiments of the inventive concept. FIG. 2 is a perspective view of the shroud unit of FIG. 1. FIG. 3 is a cross-sectional view of the shroud unit taken along the line I-I' of FIG. 2. FIG. 4 is a bottom plan view of the shroud unit of FIG. 2. FIG. 5 is a side view of the shroud unit of FIG. 2. FIG. 6 is a plan view of the shroud unit of FIG. 2.

Referring to FIGS. 1 to 6, a substrate treating system 10 according to some embodiments of the inventive concept may treat a substrate W using plasma. For example, the substrate treating system 10 may be a capacitively-coupled plasma (CCP) etching system configured to perform an etching process on the substrate W. The substrate treating system 10 may include a process chamber 100, a supporting unit 200, a plasma source unit 400, a shroud unit 300, an open/close switching unit 500, and a gas supplying unit 700. In some embodiments, the substrate treating system 10 may further include a heating unit 600. In some embodiments, the plasma source unit 400 is spaced apart from the supporting unit 200 in a vertical direction, as illustrated in FIG. 1.

The process chamber 100 may have an internal space. The process chamber 100 may include a metallic material. For example, the process chamber 100 may include aluminum (Al), but the inventive concept is not limited thereto. The process chamber 100 may be grounded.

The process chamber 100 may include a bottom wall 110, and exhausting holes 115 may be provided to penetrate the bottom wall 110. In some embodiments, each of the exhausting holes 115 may extend through a thickness of the bottom wall 110. The exhausting holes 115 may be connected to a gas exhausting unit through an exhausting line 770. Accordingly, by-products of a substrate treating process and/or a remaining gas (e.g., reactants) may be exhausted to the outside from the process chamber 100 through the exhausting line 770. As a result of such an exhausting process, an internal pressure of the process chamber 100 may be changed (e.g., decreased) and/or controlled. In the present specification, the by-products may include non-ionic species of plasma (e.g., neutral radicals).

The process chamber 100 may include a top wall 120, and a supply hole 125 may be provided to penetrate the top wall 120. The supply hole 125 may be connected to the gas supplying unit 700 through a supplying line 750. In some embodiments, the supply hole 125 may be provided at a center of the top wall 120. The top wall 120 and the bottom wall 110 may be provided to face each other. The process chamber 100 may include a sidewall 130 connecting the top wall 120 to the bottom wall 110.

The supporting unit 200 may be placed in the process chamber 100. The supporting unit 200 may be configured to support the substrate W. In some embodiments, the supporting unit 200 may also be configured to hold or fix the substrate W using an electrostatic force. In some embodiments, the supporting unit 200 may include other means (e.g., a mechanical clamp) which are configured to support or fasten the substrate W.

The supporting unit 200 may include an electrostatic chuck 210 and 220 and a ring unit 230. The electrostatic chuck 210 and 220 may be configured to support the substrate W. The electrostatic chuck 210 and 220 may include a dielectric plate 210 and a base plate 220.

The dielectric plate 210 may be placed on the base plate 220. The dielectric plate 210 may have a circular shape and may be formed of or include a dielectric material. The substrate W may be laid on a top surface of the dielectric plate 210. The top surface of the dielectric plate 210 may be provided to face the top wall 120 of the process chamber 100. The top surface of the dielectric plate 210 may have a radius smaller than that of the substrate W. Accordingly, an edge region of the substrate W may not overlap the dielectric plate 210, when viewed in a plan view.

The dielectric plate 210 may include an electrostatic electrode 211. The electrostatic electrode 211 may be overlapped by the substrate W, when viewed in the plan view. The electrostatic electrode 211 may be provided in the dielectric plate 210. The electrostatic electrode 211 may be electrically connected to an external power. If an electrical power is applied to the electrostatic electrode 211, an electrostatic force may be produced between the electrostatic electrode 211 and the substrate W. The electrostatic force may be used to fasten or hold the substrate W to the top surface of the dielectric plate 210.

The base plate 220 may be provided below the dielectric plate 210. The base plate 220 may be configured to support the dielectric plate 210 and the ring unit 230. At least one of first and second circulation conduits may be provided in the base plate 220, and the first and second circulation conduits may be used to circulate heat-transfer medium and refrigerant, respectively, in the base plate 220.

The base plate 220 may include a metallic material. For example, the base plate 220 may include aluminum (Al). The base plate 220 may be electrically connected to a first power 810. A first radio frequency (RF) power from the first power 810 may be applied to the base plate 220. Accordingly, the base plate 220 may serve as a lower electrode, which exerts an attractive force on plasma ions in a direction toward the substrate W.

The ring unit 230 may be provided to surround an upper portion of the electrostatic chuck 210 and 220. For example, the ring unit 230 may be provided along the circumference of the dielectric plate 210 to enclose the dielectric plate 210. The ring unit 230 may be provided in the form of a ring. The ring unit 230 may be configured to control an electromagnetic field, and this may be used to realize a uniform density of plasma throughout the substrate W. Accordingly, in some embodiments, each region of the substrate W may be uniformly etched. The ring unit 230 may include a focus ring.

The ring unit 230 may include an outer side portion 232 and an inner side portion 231. The inner side portion 231 may be positioned between the outer side portion 232 and the dielectric plate 210. In some embodiments, a top surface of the outer side portion 232 may be positioned to be higher than a top surface of the inner side portion 231, as illustrated in FIG. 1. In other words, the top surface of the outer side portion 232 and the top surface of the inner side portion 231 may form a stepwise structure. In some embodiments, the top surface of the inner side portion 231 may be positioned to be lower than the substrate W, and the top surface of the outer side portion 232 may be positioned to be higher than the substrate W, as illustrated in FIG. 1. Here, the top surface of the inner side portion 231 and the top surface of the outer side portion 232 may face the top wall 120 of the process chamber 100.

The plasma source unit 400 may be placed in the process chamber 100. The plasma source unit 400 may be spaced apart from the supporting unit 200 in an upward direction (e.g., a vertical direction). Accordingly, a space may be provided between the plasma source unit 400 and the supporting unit 200. The plasma source unit 400 may be configured to produce plasma using a process gas, which is supplied into the process chamber 100.

In some embodiments, the plasma source unit 400 may be a shower head. The plasma source unit 400 may include an upper electrode member 410 and a supporting portion 420. The upper electrode member 410 may be positioned between the top wall 120 of the process chamber 100 and the supporting unit 200. The upper electrode member 410 may be spaced apart from the top wall 120 of the process chamber 100 in a downward direction. Thus, a receiving space RS may be provided between the upper electrode member 410 and the top wall 120 of the process chamber 100. The receiving space RS may be connected to the supply hole 125. The upper electrode member 410 may include a plurality of injection holes 415, which are formed to penetrate the upper electrode member 410. In some embodiments, each of the plurality of injection holes 415 extends through a thickness of the upper electrode member 410. The upper electrode member 410 may be used as a gas injection plate. At least some of the injection holes 415 may overlap the supporting unit 200, when viewed in a plan view. In some embodiments, some of the injection holes 415 may overlap the supporting unit 200, as illustrated in FIG. 1.

The upper electrode member 410 may include a metallic material. The upper electrode member 410 may be electrically connected to an external power (e.g., a second power 820). A second RF power from the second power 820 may be applied to the upper electrode member 410. The second RF power may have a frequency higher than that of the first RF power. In the case where the second RF power is applied to the upper electrode member 410, a process gas in the process chamber 100 and/or the shroud unit 300 may be ionized by the second RF power of the upper electrode member 410, thereby forming plasma. For example, in the substrate treating system 10, the plasma source unit 400 may be used as an upper electrode.

The supporting portion 420 may be provided to connect the upper electrode member 410 to the top wall 120 of the process chamber 100. For example, the supporting portion 420 may include a bottom portion, which is connected to the upper electrode member 410, and a top portion, which is connected to the top wall 120 of the process chamber 100. In some embodiments, the supporting portion 420 may be provided to have a cylindrical shape. The supporting portion 420 may be provided to enclose or delimit the receiving space RS. The supporting portion 420 may include a non-metallic material.

The shroud unit 300 may be placed in the process chamber 100. The shroud unit 300 may be configured to enclose a space between the supporting unit 200 and the plasma source unit 400. Accordingly, the shroud unit 300 may have an internal space (hereinafter, a processing space PS), whose volume is smaller than that of an internal space of the process chamber 100. In other words, the shroud unit 300 may serve as a sub chamber whose volume is smaller than that of the process chamber 100. It will be understood that the shroud unit 300 may contain plasma therein during a process (See FIG. 12B).

A processing space PS may be positioned between the supporting unit 200 and the plasma source unit 400 and may be a portion of the internal space of the process chamber 100. The plasma source unit 400 may be configured to produce plasma using a process gas in the processing space PS. The substrate W may be located in the processing space PS, as will be described below. That is, the processing space PS may be a space where a substrate treating process using plasma will be performed. Since the plasma is produced in the shroud unit 300, it may be possible to reduce or prevent the process chamber 100 from being damaged by the plasma.

The shroud unit 300 may include the same material as the substrate W. For example, the shroud unit 300 may be formed of or include silicon (Si). The shroud unit 300 may include a plurality of exhaust holes 340. The shroud unit 300 will be described in more detail below.

The open/close switching unit 500 may be configured to open or close the exhaust holes 340 of the shroud unit 300. The open/close switching unit 500 may include a shielding portion 510 and a driving portion 520. The open/close switching unit 500 will be described in more detail below.

The gas supplying unit 700 may be configured to supply a process gas into the process chamber 100. The gas supplying unit 700 may be connected to the supply hole 125 through the supplying line 750. The gas exhausting unit may be configured to exhaust gas in the chamber to the outside of the chamber. The gas exhausting unit may be connected to the exhausting holes 115 through the exhausting line 770. In some embodiments, the gas exhausting unit may include a vacuum pump.

The heating unit 600 may be placed in the process chamber 100. In some embodiments, the heating unit 600 may include a first heating member 610 and a second heating member 620. The first heating member 610 may be placed in the receiving space RS. The first heating member 610 may be a ring-shaped structure, in which a through hole overlapped by the supply hole 125 is provided. The second heating member 620 may be positioned outside the plasma source unit 400. In other words, the second heating member 620 may be a ring-shaped structure surrounding the plasma source unit 400.

The heating unit 600 may be configured to heat a process gas supplied into the process chamber 100. In other words, the heating unit 600 may be used to supply heat energy to the process gas. If the heat energy from the heating unit 600 is provided to the process gas, the process gas may be more easily excited or ionized by the plasma source unit 400.

According to some embodiments of the inventive concept, the shroud unit 300 may be configured to have a first opening 350 and a second opening 355. The first opening 350 may be overlapped by the second opening 355, when viewed in a plan view. In some embodiments, the second opening 355 may overlap the first opening 350, as illustrated in FIG. 1. The first opening 350 and the second opening 355 may be connected to the processing space PS.

In some embodiments, a portion of the dielectric plate 210 of the supporting unit 200 may be inserted into the first opening 350. Accordingly, the substrate W may be placed in the processing space PS of the shroud unit 300. A portion of the plasma source unit 400 may be placed in (e.g., may extend through) the second opening 355. In some embodiments, the upper electrode member 410 of the plasma source unit 400 may be placed in the second opening 355, as illustrated in FIG. 1. The first opening 350 and the second opening 355 may have a circular shape, when viewed in a plan view, but the inventive concept is not limited thereto. The first opening 350 and the second opening 355 may have various shapes.

Referring to FIG. 1, the shroud unit 300 may also include a first flange portion 310, a sidewall portion 320, and a second flange portion 330. The sidewall portion 320 of the shroud unit 300 may face the sidewall 130 of the process chamber 100 and may be spaced apart from the sidewall 130 of the process chamber 100. The first flange portion 310 may face the bottom wall 110 of the process chamber 100 and may extend horizontally from the sidewall portion 320 of the shroud unit 300. The second flange portion 330 may face the top wall 120 of the process chamber 100 and may extend horizontally from the sidewall portion 320 of the shroud unit 300. In some embodiments, the first flange portion 310 and the second flange portion 330 may extend from respective opposing ends of the sidewall portion 320 of the shroud unit 300, which are spaced apart from each other in the vertical direction, as illustrated in FIG. 1.

The shroud unit 300 may include the plurality of exhaust holes 340, which are formed in the sidewall portion 320 and the first flange portion 310. Each of the exhaust holes 340 may extend from the sidewall portion 320 to the first flange portion 310. Each of the exhaust holes 340 may include a first slit 341, which is in the first flange portion 310, and a second slit 342, which is in the sidewall portion 320. The first slit 341 may be connected to the second slit 342. The exhaust holes 340 may be arranged along the circumference of the supporting unit 200 and/or along the circumference of the first opening 350.

The first flange portion 310 may be provided to surround the supporting unit 200. For example, the first flange portion 310 may be provided to surround an upper portion of the dielectric plate 210. The first flange portion 310 may be a ring-shaped structure defining the first opening 350. The first flange portion 310 may be connected to an end of the sidewall portion 320, as illustrated in FIG. 2.

In some embodiments, a plurality of the first slits 341 may penetrate the first flange portion 310. In some embodiments, the first slits 341 may extend though a thickness of the first flange portion 310, as illustrated in FIG. 2. When viewed in a plan view, each of the first slits 341 may extend radially as illustrated in FIG. 4. For example, the first slit 341 may be extended from an outer side surface 312 of the first flange portion 310 toward an inner side surface 311 of the first flange portion 310. Each of the first slits 341 may be provided to have an approximately linear shape. For example, each of the first slits 341 may have a line shape as illustrated in FIG. 4. A first end of each of the first slits 341 may be closed. A second end of each of the first slit 341, which is opposite the first end of each of the first slits 341 may be opened. The first ends of the first slits 341 may be located adjacent to the inner side surface 311 of the first flange portion 310. The first slits 341 may be arranged around the supporting unit 200 and/or around the first opening 350. In some embodiments, the first slits 341 may be arranged with a uniform interval along the circumference of the first flange portion 310. In some embodiments, the first slits 341 may be spaced apart from each other by a uniform distance, as illustrated in FIG. 4.

The sidewall portion 320 may be extended from the first flange portion 310 toward the plasma source unit 400. In some embodiments, the sidewall portion 320 may extend in a vertical direction as illustrated in FIG. 1. In some embodiments, the sidewall portion 320 may be extended from the first flange portion 310 toward the second flange portion 330. For example, the sidewall portion 320 may be provided to connect the first flange portion 310 to the second flange portion 330. The sidewall portion 320 may be provided in the form of a cylinder. In some embodiments, the sidewall portion 320 may be vertically extended from the first flange portion 310. In some embodiments, the sidewall portion 320 may be slantingly extended from the first flange portion 310. The sidewall portion 320 may be spaced apart from the sidewall 130 of the process chamber 100. The sidewall portion 320 may face the sidewall 130 of the process chamber 100.

The second slits 342 may be provided to penetrate the sidewall portion 320. In some embodiments, each of the second slits 342 may extend through a thickness of the sidewall portion 320. Each of the second slits 342 may be extended from one of the first slits 341 toward the plasma source unit 400 and/or the second opening 355. Each of the first slits 341 may be connected to one of the second slits 342, as illustrated in FIG. 2. In some embodiments, each of the second slits 342 may be connected to the second end of one of the first slits 341. A bottom portion of the second slit 342 may be opened, and a top portion of the second slit 342 may be closed. The second slits 342 may be arranged with a uniform interval along the circumference of the sidewall portion 320. In some embodiments, the second slits 342 may be spaced apart from each other in a uniform distance, as illustrated in FIGS. 2 and 5. In some embodiments, each of the second slits 342 may have a rectangular shape and may extend longitudinally in a vertical direction, as illustrated in FIGS. 1 and 2.

In some embodiments, a second width W2 of each of the second slits 342 may be substantially equal to a first width W1 of each of the first slits 341. The first and second widths W1 and W2 of the first and second slits 341 and 342 may be smaller than two times a thickness of a plasma sheath region. In some embodiments, the first and second widths W1 and W2 of the first and second slits 341 and 342 may be larger than 0 mm and smaller than about 26 mm. It will be understood that the plasma sheath region may be a non-luminescent thin region, which is formed near plasma, and, in the plasma sheath region, ionization caused by electrons are seldom produced. In the case where the first and second widths W1 and W2 of the first and second slits 341 and 342 are smaller than two times the thickness of the sheath region, the sheath region may be formed to cover the first and second slits 341 and 342. Accordingly, it may be possible to reduce or prevent leakage of plasma ions from to the outside of the shroud unit 300 through the first and second slits 341 and 342. However, non-ionic species of plasma may be exhausted to the outside of the shroud unit 300 through the first and second slits 341 and 342. In the present specification, the first width W1 of the first slit 341 may refer to a short length of the first slit 341, and the width W2 of the second slit 342 may refer to a short length of the second slit 342, as illustrated in FIGS. 4 and 5.

An outer diameter of the first flange portion 310 and a diameter of the sidewall portion 320 may be larger than an inner diameter of the first flange portion 310. In some embodiments, a space S3 between adjacent ones of the second slits 342 may be larger than a space S1 between the first ends of adjacent ones of the first slits 341. In the case where the widths W1 of the first slits 341 are uniform, a space S2 between the second ends of adjacent ones of the first slits 341 may be larger than the space S1 between the first ends of the adjacent ones of the first slits 341, as illustrated in FIG. 4.

Since the sidewall portion 320 vertically or upwardly extends from the first flange portion 310, the second slits 342 may also vertically or upwardly extend from the first slits 341. Accordingly, each of the exhaust holes 340 may have a substantially "L"-shaped cross-section. It will be understood that the vertical direction may refer to a direction from the bottom wall 110 toward the top wall 120 or from the top wall 120 toward the bottom wall 110.

The second flange portion 330 may be positioned above the first flange portion 310. The second flange portion 330 may be spaced apart from the first flange portion 310. The second flange portion 330 may be connected to other end of the sidewall portion 320. The second flange portion 330 may be a ring-shaped structure defining the second opening 355. The second flange portion 330 may overlap the first flange portion 310, when viewed in a plan view.

The second flange portion 330 may be provided to surround a lower portion of the plasma source unit 400. For example, the second flange portion 330 may be extended from the sidewall portion 320 toward the upper electrode member 410 to surround the upper electrode member 410. The second flange portion 330 may be electrically connected to the upper electrode member 410. Thus, if the second RF power is applied to the upper electrode member 410, the second flange portion 330 may perform a function of the upper electrode member 410.

In some embodiments, the open/close switching unit 500 may be used to open or close the exhaust holes 340 including the first slits 341 and the second slits 342. In the case where the first slits 341 and the second slits 342 are closed by the open/close switching unit 500, it may be possible to more effectively reduce or prevent leakage of plasma ions to the outside of the shroud unit 300 through the first slits 341 and the second slits 342.

The open/close switching unit 500 may include the shielding portion 510 and the driving portion 520. The driving portion 520 may be used to move the shielding portion 510. The shielding portion 510 may be moved by the driving portion 520, and this movement of the shielding portion 510 may be used to open or close the first slits 341 and/or the second slits 342.

In some embodiments, the shielding portion 510 may include a first shielding member 511 and a second shielding member 512. The first shielding member 511 may be positioned below the shroud unit 300, as illustrated in FIG. 1. For example, the first shielding member 511 may be positioned below the first flange portion 310, as illustrated in FIG. 1. The first shielding member 511 may be overlapped by the first slits 341 and/or the first flange portion 310, when viewed in a plan view. The first shielding member 511 may be provided in the form of a ring, when viewed in a plan view. The first shielding member 511 may surround the supporting unit 200. For example, the first shielding member 511 may be formed of or include quartz and/or silicon oxide ($SiO_2$).

The second shielding member 512 may be positioned outside the shroud unit 300. For example, the second shielding member 512 may be positioned between the sidewall portion 320 and the sidewall 130 of the process chamber 100. The second shielding member 512 may be shaped like a cylinder with open top and bottom. An inner diameter of the second shielding member 512 may be larger than an outer diameter of the shroud unit 300. Accordingly, the second shielding member 512 may be provided to enclose the circumference of the shroud unit 300. For example, the second shielding member 512 may be formed of or include quartz and/or silicon oxide ($SiO_2$).

The driving portion 520 may include a first driving portion 521 and a second driving portion 522. The first driving portion 521 may be configured to mover the first shielding member 511 in a direction toward or against the first flange portion 310. For example, the first driving portion 521 may be configured to move the first shielding member 511 in a vertical direction.

The second driving portion 522 may be configured to move the second shielding member 512 in a direction toward or away from the first flange portion 310. For example, the second driving portion 522 may be configured to move the second shielding member 512 in the vertical direction. Each of the first and second driving portions 521 and 522 may include, for example, a pneumatic cylinder, a hydraulic cylinder, and so forth. In some embodiments, the first and second driving portions 521 and 522 may be installed in or through the top wall 120 of the process chamber 100.

Figure 7A:
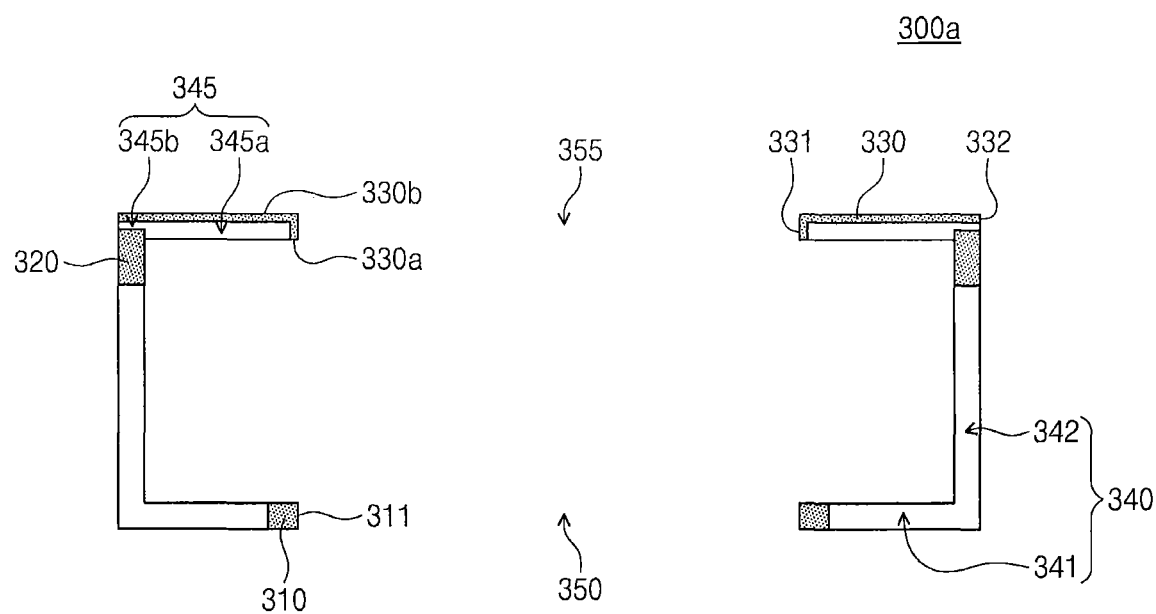
FIG. 7A is a cross-sectional view a shroud unit according to some embodiments of the inventive concept.
Figure 7B:
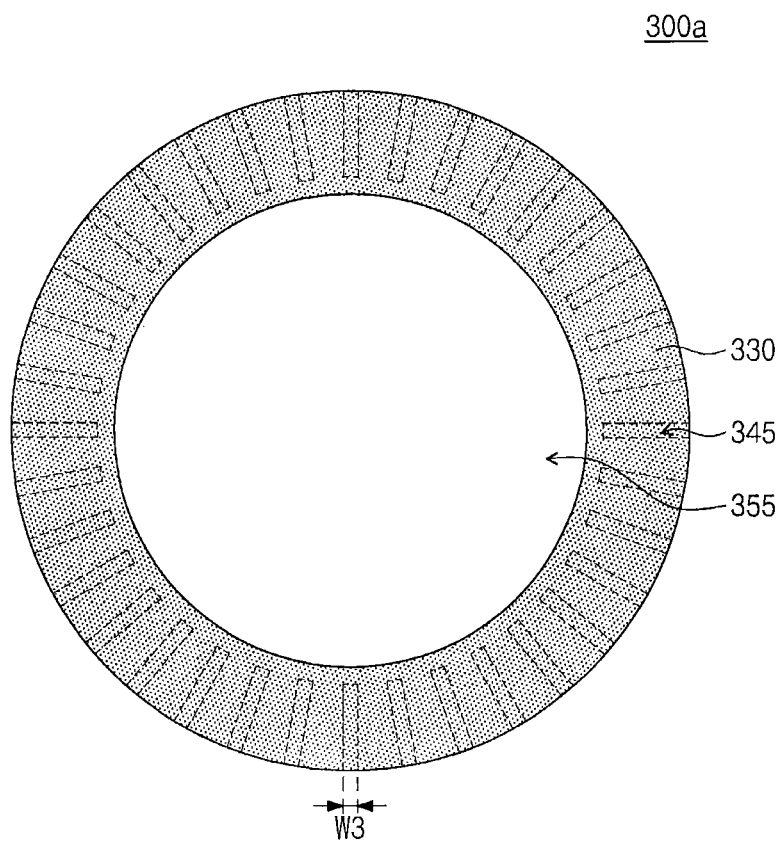
FIG. 7B is a plan view of the shroud unit of FIG. 7A.
Figure 8A:
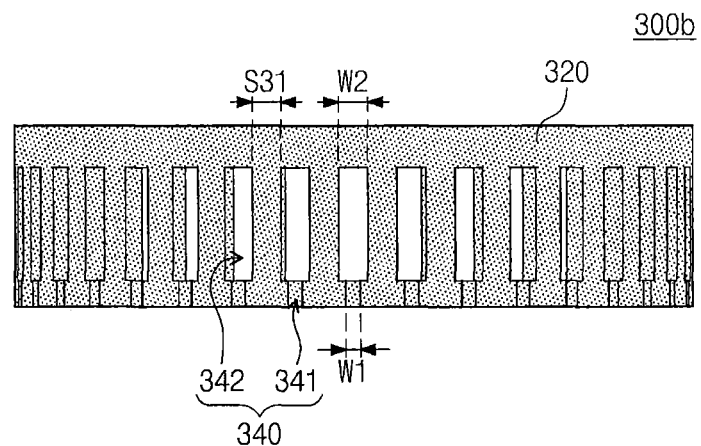
FIG. 8A is a side view of a shroud unit according to some embodiments of the inventive concept.
Figure 8B:
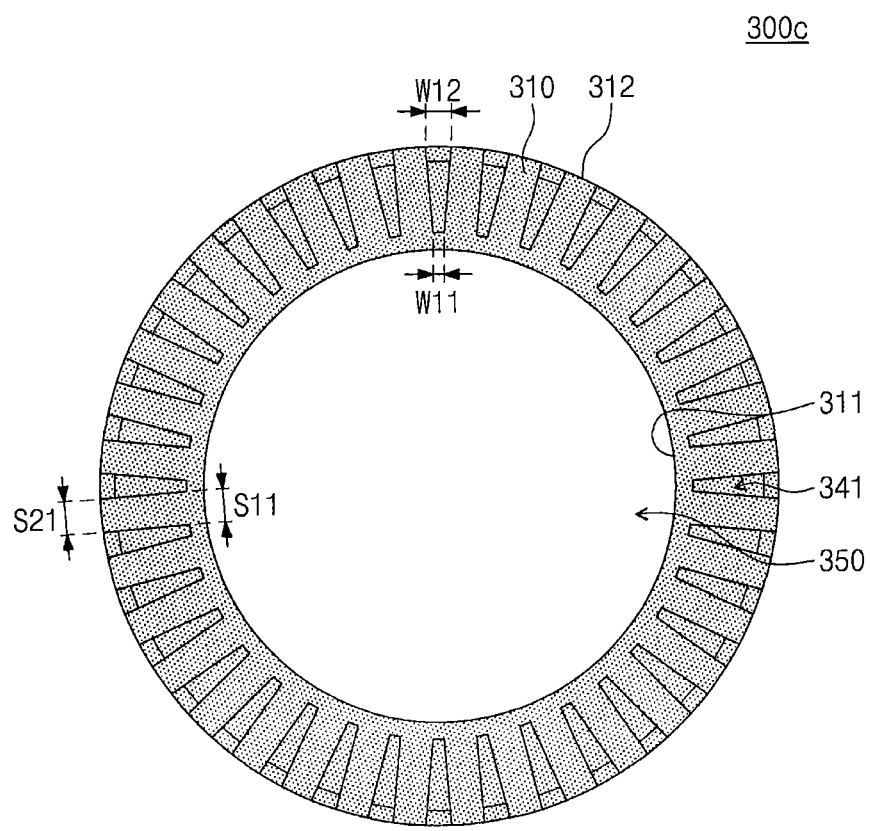
FIG. 8B is a plan view of a shroud unit according to some embodiments of the inventive concept.
Figure 8C:
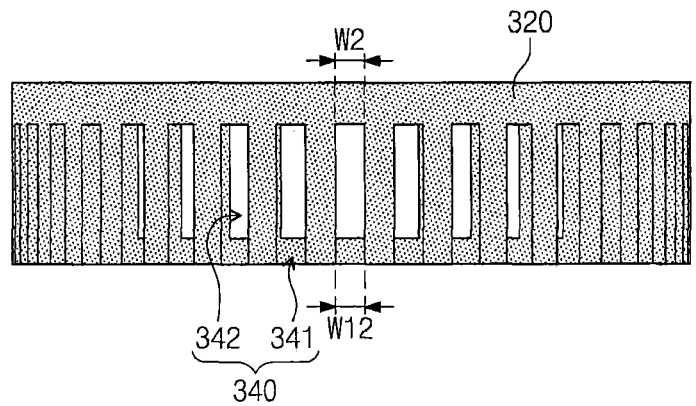
FIG. 8C is a side view of the shroud unit of FIG. 8B.
Figure 8D:
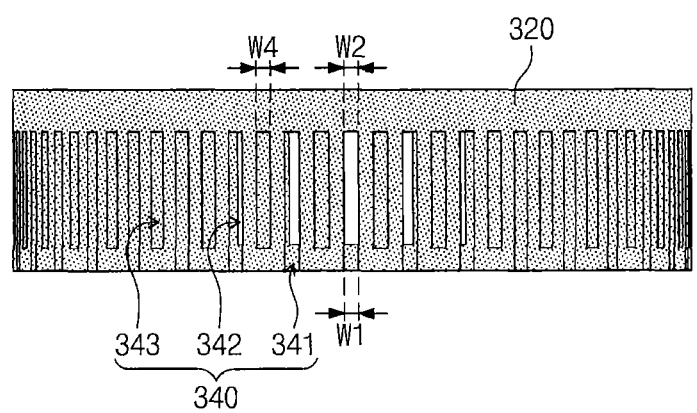
FIGS. 8D and 8E are side views of shrouds unit according to some embodiments of the inventive concept.
Figure 8E:
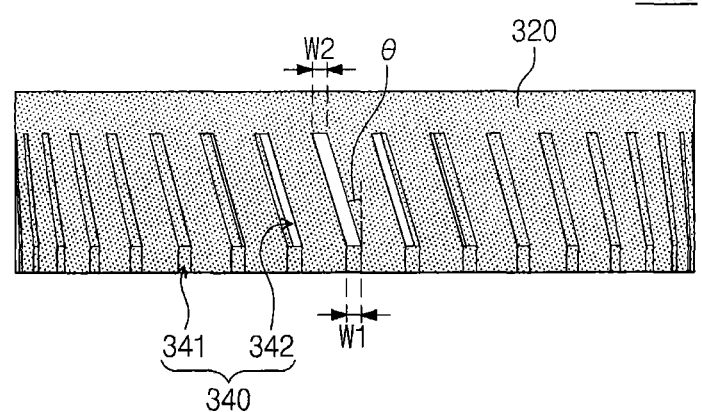

FIG. 7A is a cross-sectional view of a shroud unit according to some embodiments of the present inventive concept. FIG. 7B is a plan view of the shroud unit of FIG. 7A. FIG. 8A is a side view of a shroud unit of FIG. 1 according to some embodiments of the inventive concept. FIG. 8B is a plan view of a shroud unit according to some embodiments of the inventive concept. FIG. 8C is a side view of the shroud unit of FIG. 8B. FIGS. 8D and 8E are side views of shroud units according to some embodiments of the inventive concept.

Referring to FIGS. 7A and 7B, a shroud unit 300a may include the first flange portion 310, the second flange portion 330, and the sidewall portion 320. The shroud unit 300a may include the first opening 350, the second opening 355, and the plurality of exhaust holes 340. Each of the exhaust holes 340 may include a first slit 341 and a second slit 342 that is connected to the first slit 341.

The second flange portion 330 may be provided in the form of a ring. The second flange portion 330 may have a top surface 330b and a bottom surface 330a facing each other. The second flange portion 330 may include an inner side surface 331 and an outer side surface 332. The second flange portion 330 may be provided to have upper exhaust holes 345. Each of the upper exhaust holes 345 may include an upper opening 345a and a lateral opening 345b. The upper opening 345a may be an empty region (e.g., cavity) that is recessed from the bottom surface 330a of the second flange portion 330 toward the top surface 330b of the second flange portion 330. In other words, the upper opening 345a may be a groove-shaped structure. Accordingly, it may be possible to reduce or prevent exhaustion of by-products, which are produced in the processing space PS (e.g., see FIG. 1), into a space above the shroud unit 300a.

The lateral opening 345b may be connected to the upper opening 345a. The lateral opening 345b may be extended from the outer side surface 332 of the second flange portion 330 toward the upper opening 345a. The lateral opening 345b may be positioned outside the upper opening 345a. Accordingly, the by-products in the upper opening 345a may be radially or outwardly exhausted through the lateral opening 345b.

The upper opening 345a may be positioned between the inner and outer side surfaces 331 and 332 of the second flange portion 330. The upper opening 345a may be elongated in a radial direction, when viewed in a plan view, as illustrated in FIG. 7B. The upper openings 345a and the lateral openings 345b may be arranged with a uniform interval along the circumference of the second flange portion 330. In some embodiments, each of the upper exhaust holes 345 may have a line shape, and the upper exhaust holes 345 are spaced apart from each other by a uniform distance, as illustrated in FIG. 7B.

A width W3 of the upper exhaust hole 345 may be larger than 0 mm and smaller than about 26 mm. Accordingly, plasma ions may not be exhausted to the outside of the shroud unit 300 through the upper exhaust holes 345, and non-ionic species of plasma may be exhausted to the outside of the shroud unit 300 through the upper exhaust holes 345.

Referring to FIG. 8A, a shroud unit 300b may include the first slits 341 and the second slits 342, and each of the second slits 342 is connected to one of the first slits 341. Each of the first slits 341 may be provided to have a first width W1.

As described above, an outer diameter of the first flange portion 310 (e.g., see FIG. 4) and a diameter of the sidewall portion 320 may be larger than an inner diameter of the first flange portion 310. As shown in FIG. 5, in the case where the width W2 of the second slits 342 is substantially equal to the first width W1 of the first slits 341, the sidewall portion 320 may have a first marginal region, allowing the width W2 of the second slits 342 to be increased. The first marginal region may be a region of the sidewall portion 320, which is located between adjacent ones of the second slits 342. The second width W2 of the second slits 342 of FIG. 8A may be larger than the width W2 of the second slits 342 of FIG. 5. In other words, the second width W2 of each of the second slits 342 may be larger than the first width W1 of each of the first slits 341. Accordingly, the shroud unit 300b of FIG. 8A may have an enlarged slit region, when compared with the shroud unit 300 (e.g., see FIG. 2) of FIG. 1. Here, the slit region may refer to the first and second slits 341 and 342, which are formed in the shroud unit 300b.

Referring to FIGS. 8B and 8C, a shroud unit 300c may include the first slits 341 and the second slits 342, and each of the second slits 342 is connected to one of the first slits 341.

As described above, an outer diameter of the first flange portion 310 and a diameter of the sidewall portion 320 may be larger than an inner diameter of the first flange portion 310. Accordingly, the first flange portion 310 may have second marginal regions, allowing a width W12 of the second end of each of the first slits 341 to be increased. Here, each of the second marginal regions may be a region of the first flange portion 310, which is located between the second ends of adjacent ones of the first slits 341.

The width W12 of the second end of each of the first slits 341 of the shroud unit 300c of FIG. 8B may be larger than the width W1 of the second ends of each of the first slits 341 of the shroud unit 300b of FIG. 8A. In other words, the width W12 of the second end of each of the first slits 341 of the shroud unit 300c of FIG. 8B may be larger than a width W11 of the first end of each of the first slits 341 of the shroud unit 300c of FIG. 8B. In some embodiments, each of the first slits 341 may have an increasing width (e.g., a gradually increasing width) in a direction from the first end of the first slit 341 toward the second end of the first slit 341, as illustrated in FIG. 8B. The second width W2 of each of the second slits 342 may be larger than the width W11 of the first end of each of the first slits 341. The second width W2 of each of the second slits 342 may be substantially equal to the width W12 of the second end of each of the first slits 341. Accordingly, the shroud unit 300c of FIG. 8B may have an enlarged slit region, when compared with the shroud units 300 and 300b of FIGS. 2 and 8A.

A space S21 between second ends of adjacent ones of the first slits 341 may be substantially equal to a space S11 between first ends of the adjacent ones of the first slits 341.

Referring to FIG. 8D, a shroud unit 300d may include the first slits 341, the second slits 342, and third slits 343. Each of the second slits 342 is connected to one of the first slits 341.

As described above, an outer diameter of the first flange portion 310 and a diameter of the sidewall portion 320 may be larger than an inner diameter of the first flange portion 310. In some embodiments, since the first width W1 of each of the first slits 341 is substantially equal to the second width W2 of each of the second slits 342, the sidewall portion 320 may have the first marginal region.

The third slits 343 may be provided in the sidewall portion 320. The third slits 343 may be provided to penetrate the sidewall portion 320. In some embodiments, each of the third slits 343 may extend through a thickness of the sidewall portion 320. Each of the third slits 343 may be positioned between adjacent ones of the second slits 342. In other words, the third slits 343 may be provided in the first marginal region. Accordingly, the sidewall portion 320 in the shroud unit 300d of FIG. 8D may have an enlarged slit region, when compared with the shroud unit 300 of FIGS. 1 and 2. In some embodiments, each of the third slits 343 may have a fourth width W4. In some embodiments, the fourth width W4 is substantially equal to the second width W2.

Referring to FIG. 8E, the shroud unit 300e may include the first flange portion 310, the second flange portion 330, and the sidewall portion 320. The exhaust holes 340 may include the first slits 341 and the second slits 342, and each of the second slits 342 is connected to one of the first slits 341. The second slits 342 may be formed to be inclined at an angle 'θ' to the first flange portion 310. In some embodiments, the second slits 342 may be provided to have a linear shape, but the inventive concept is not limited thereto.

Figure 9:
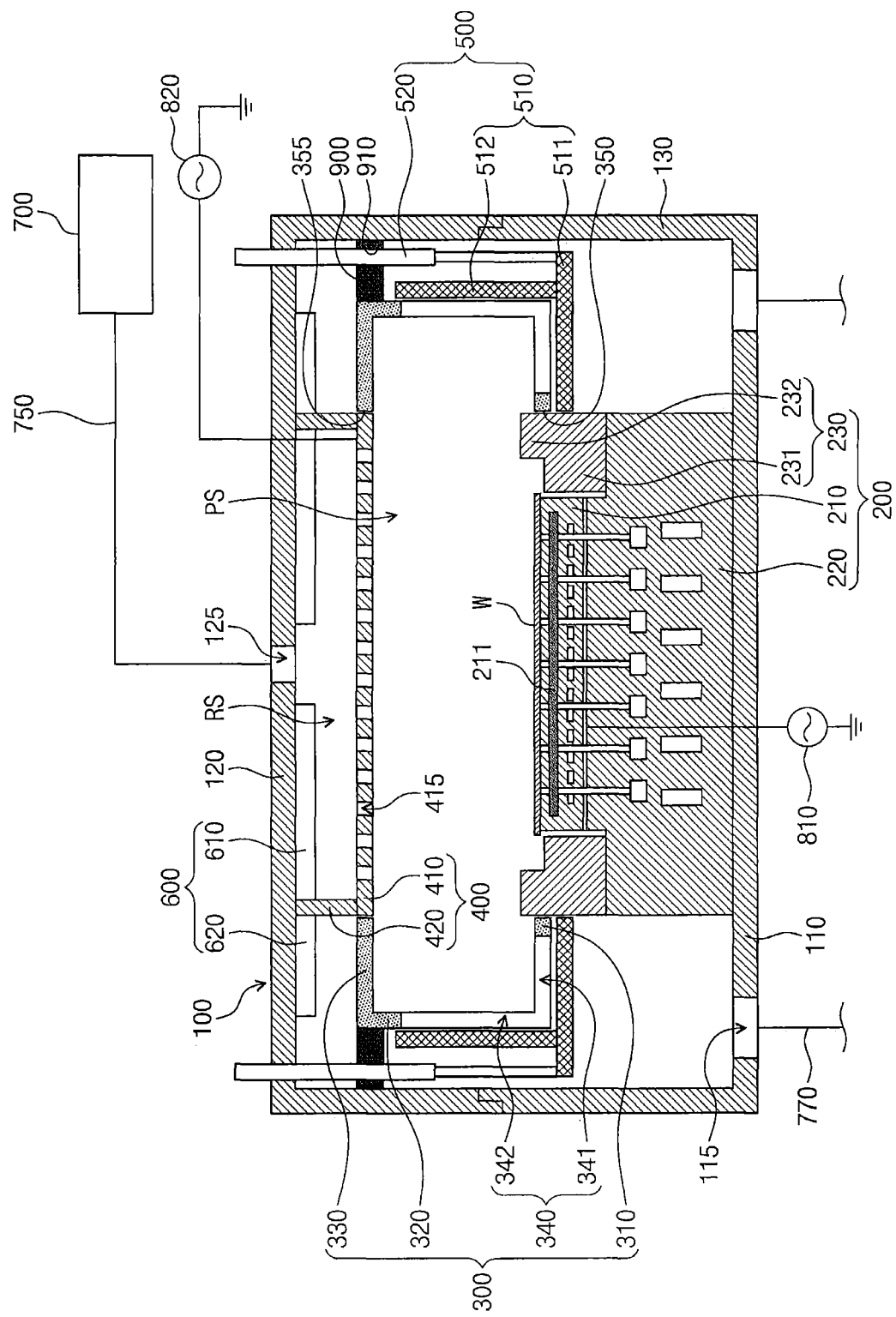

FIGS. 9 and 10 illustrate substrate treating systems according to some embodiments of the present inventive concept.

Referring to FIG. 9, a substrate treating system 11 according to some embodiments of the inventive concept may be a capacitively-coupled plasma system. The substrate treating system 11 may include the process chamber 100, the supporting unit 200, the plasma source unit 400, the shroud unit 300, the open/close switching unit 500, the gas supplying unit 700, and the heating unit 600. The substrate treating system 11 of FIG. 9 may further include a sealing member 900 that the substrate treating system 10 of FIG. 1 does not include.

The sealing member 900 may be configured to reduce or possibly prevent leakage of a process gas, by-products, and so forth into a space above the shroud unit 300. The sealing member 900 may be positioned between the shroud unit 300 and the sidewall 130 of the process chamber 100. The sealing member 900 may be provided to hermetically seal a gap region between the shroud unit 300 and the sidewall 130 of the process chamber 100. The sealing member 900 may be positioned above the second slits 342. The sealing member 900 may be formed of or include, for example, quartz and/or silicon oxide.

The sealing member 900 may be provided in the form of a ring, when viewed in a plan view. The sealing member 900 may be provided to surround the sidewall portion 320 of the shroud unit 300. In some embodiments, the sealing member 900 may have a through hole 910, which is formed to allow the driving portion 520 of the open/close switching unit 500 to pass therethrough.

The shielding portion 510 of FIG. 9 may include the first shielding member 511 and the second shielding member 512. The first and second shielding members 511 and 512 of FIG. 1 may be elements that are separated from each other, whereas the first and second shielding members 511 and 512 of FIG. 9 may be connected to each other to form a single object. Accordingly, the first and second shielding members 511 and 512 may be simultaneously moved by the driving portion 520. The first shielding member 511 and the second shielding member 512 may be provided to be perpendicular to each other. In some embodiments, the second shielding member 512 of the shielding portion 510 may be omitted.

Referring to FIG. 10, a substrate treating system 12 according to some embodiments of the inventive concept may include a process chamber 100a, the supporting unit 200, a plasma source unit 400, the shroud unit 300a, and the gas supplying unit 700. The substrate treating system 12 of FIG. 10 may be an inductively-coupled plasma system, unlike the substrate treating system 10 of FIG. 1.

The process chamber 100a may include a housing 110 and 130 and a sealing cover 121. The housing 110 and 130 may be provided to have an opened top. The housing 110 and 130 may include the bottom wall 110 and the sidewall 130. The sealing cover 121 may be provided to cover the opened top of the housing 110 and 130. The sealing cover 121 may be provided in the form of a plate. The sealing cover 121 may be provided to include a dielectric window. The sealing cover 121 may have the supply hole 125, which is formed to penetrate therethrough.

The plasma source unit 400a may be positioned on the process chamber 100a. For example, the plasma source unit 400a may be positioned on the sealing cover 121. The plasma source unit 400a may include an antenna room 450 and an antenna 460.

The antenna room 450 may be provided in the form of a cylinder with open bottom. The antenna room 450 may include a bottom portion that is coupled to a top surface 121a of the sealing cover 121. Accordingly, the sealing cover 121 may cover an open bottom of the antenna room 450. The antenna room 450 may be provided to have a diameter corresponding to that of the housing 110 and 130.

The antenna 460 may be provided in the antenna room 450. The antenna 460 may be a helical coil, which is wound several times. The antenna 460 may be connected to the second power 820 described above. If an electric power from the second power 820 is applied to the antenna 460, an electromagnetic field may be produced in the process chamber 100a to excite or ionize a process gas in the process chamber 100 and/or the shroud unit 300a. In other words, the process gas in the processing space PS of the shroud unit 300a may be excited to a plasma state by the electromagnetic field.

The shroud unit 300a may be placed in the process chamber 100a. The shroud unit 300a of FIG. 10 may not have the second flange portion 330, unlike the shroud unit 300 of FIG. 1. The sidewall portion 320 of the shroud unit 300a may be coupled to a bottom surface 121b of the sealing cover 121.

The shielding portion 510 of FIG. 10 may include the first and second shielding members 511 and 512. The first and second shielding members 511 and 512 of FIG. 1 may be elements that are separated from each other, whereas the first and second shielding members 511 and 512 of FIG. 10 may be connected to each other to form a single object. Accordingly, the first and second shielding members 511 and 512 may be simultaneously moved by the driving portion 520. The driving portion 520 may be installed in or through the bottom wall 110.

Figure 11A:
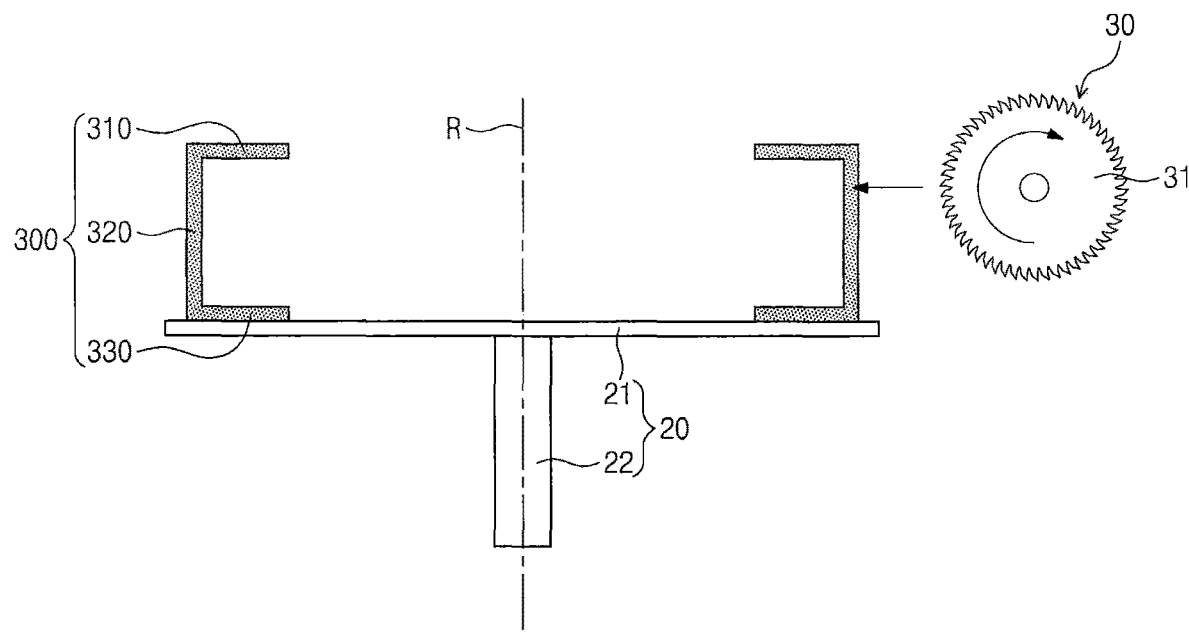
FIGS. 11A to 11C illustrate a process of forming exhaust holes of the shroud of FIG. 1.
Figure 11B:
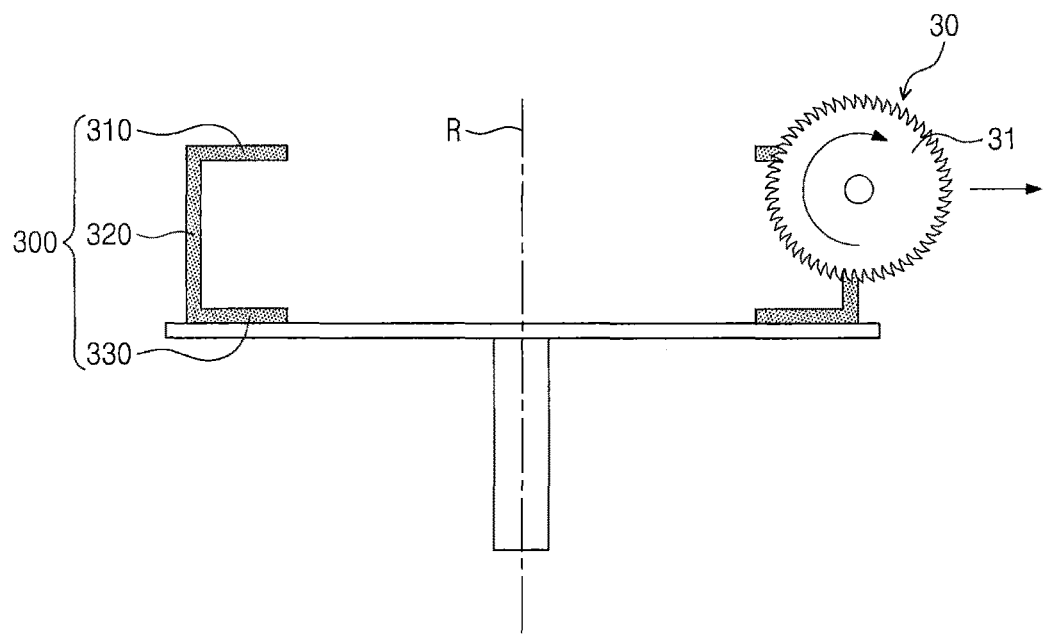
Figure 11C:
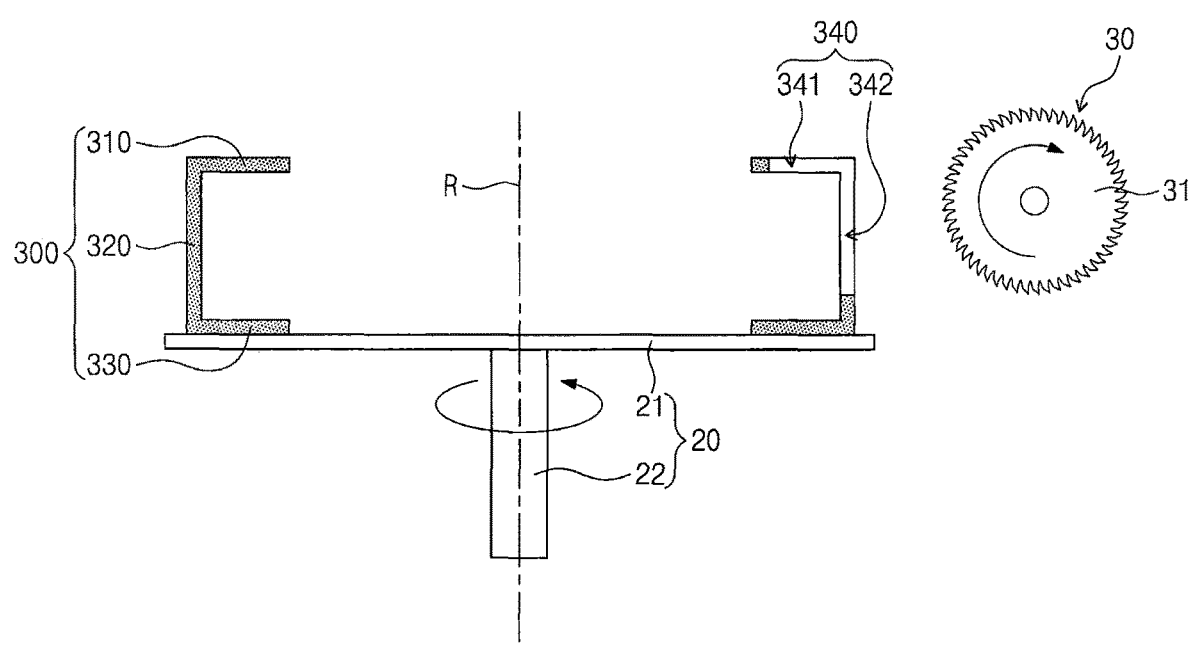

FIGS. 11A to 11C illustrate a process of forming exhaust holes of the shroud unit of FIG. 1.

Referring to FIG. 11A, the shroud unit 300, in which the exhaust hole 340 is not formed, may be placed on a rotation unit 20. The rotation unit 20 may include a support plate 21 and a first rotary driving portion 22. The shroud unit 300 may be disposed in such a way that the second flange portion 330 faces or is in contact with the support plate 21. The first rotary driving portion 22 may be configured to rotate the support plate 21. The first rotary driving portion 22 may include a motor.

A sawing unit 30, which is disposed near the rotation unit 20, may move toward the shroud unit 300. For example, the sawing unit 30 may move toward a rotation axis R of the rotation unit 20. The sawing unit 30 may include a polishing member 31 and a second rotary driving portion. The polishing member 31 may be provided in the form of a circular plate. An outer circumference of the polishing member 31 may be coated or provided with diamond. The second rotary driving portion may be configured to rotate the polishing member 31. The second rotary driving portion may include a motor.

Referring to FIG. 11B, the polishing member 31 of the sawing unit 30 may be used to saw or cut a portion of the first flange portion 310 and a portion of the sidewall portion 320. Thereafter, the polishing member 31 may return to its original position. Thus, a sawing process may be completed once.

As shown in FIG. 11C, after the sawing process is completed once, a first slit 341 may be formed in the first flange portion 310, and a second slit 342 connected to the first slit 341 may be formed in the sidewall portion 320. That is, by performing the sawing process once, one exhaust hole 340 may be formed in the shroud unit 300.

After the sawing process is completed once, the rotation unit 20 may rotate the shroud unit 300 by a desired angle. In other words, a rotation process of the shroud unit 300 may be performed. After the shroud unit 300 is rotated, the sawing process using the sawing unit 30 may be performed on the shroud unit 300 again. The sawing and rotation processes may be repeated to manufacture the shroud unit 300 in a desired shape.

Figure 12A:
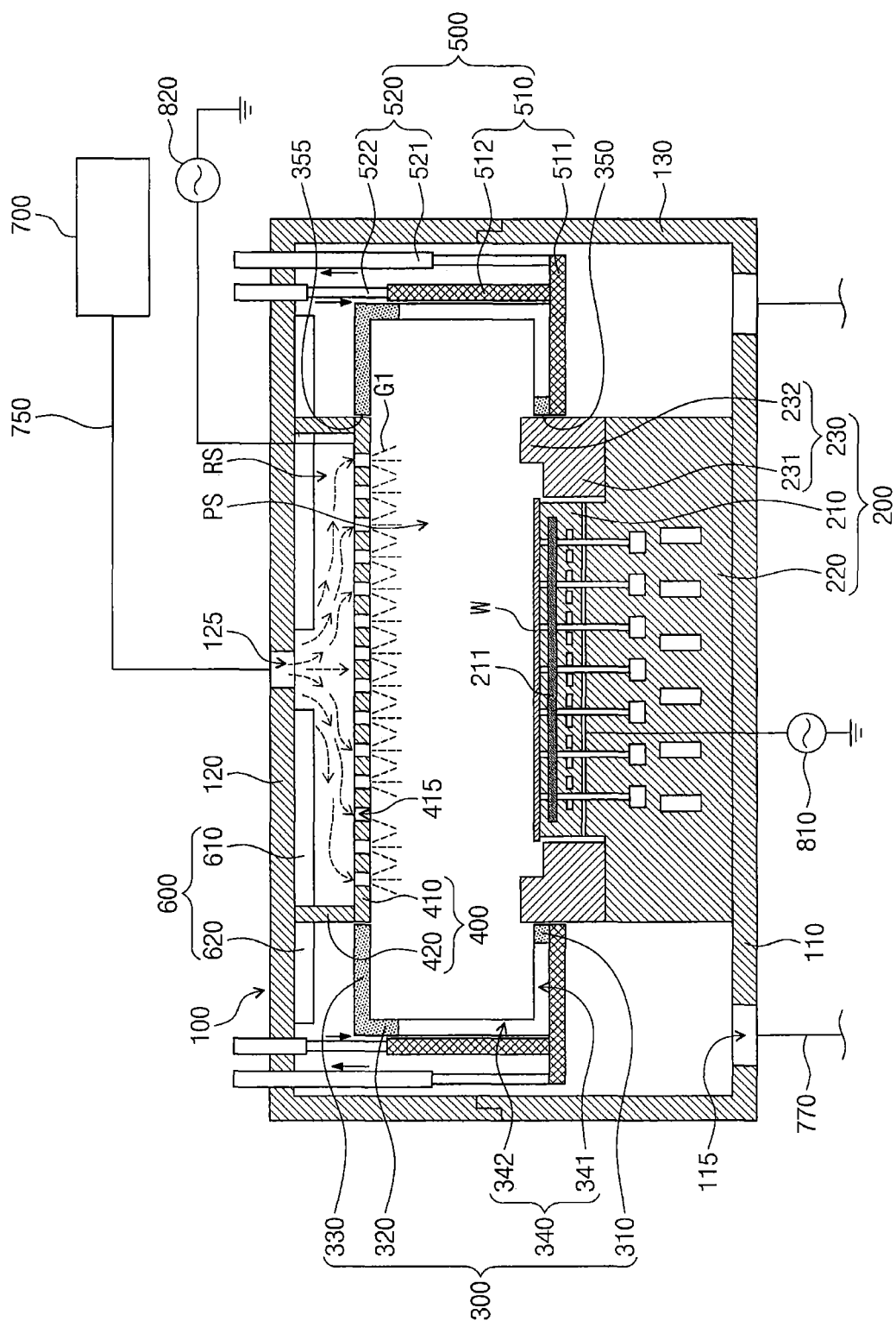
FIGS. 12A to 12C illustrate a process of treating a substrate using the substrate treating system of FIG. 1.
Figure 12B:
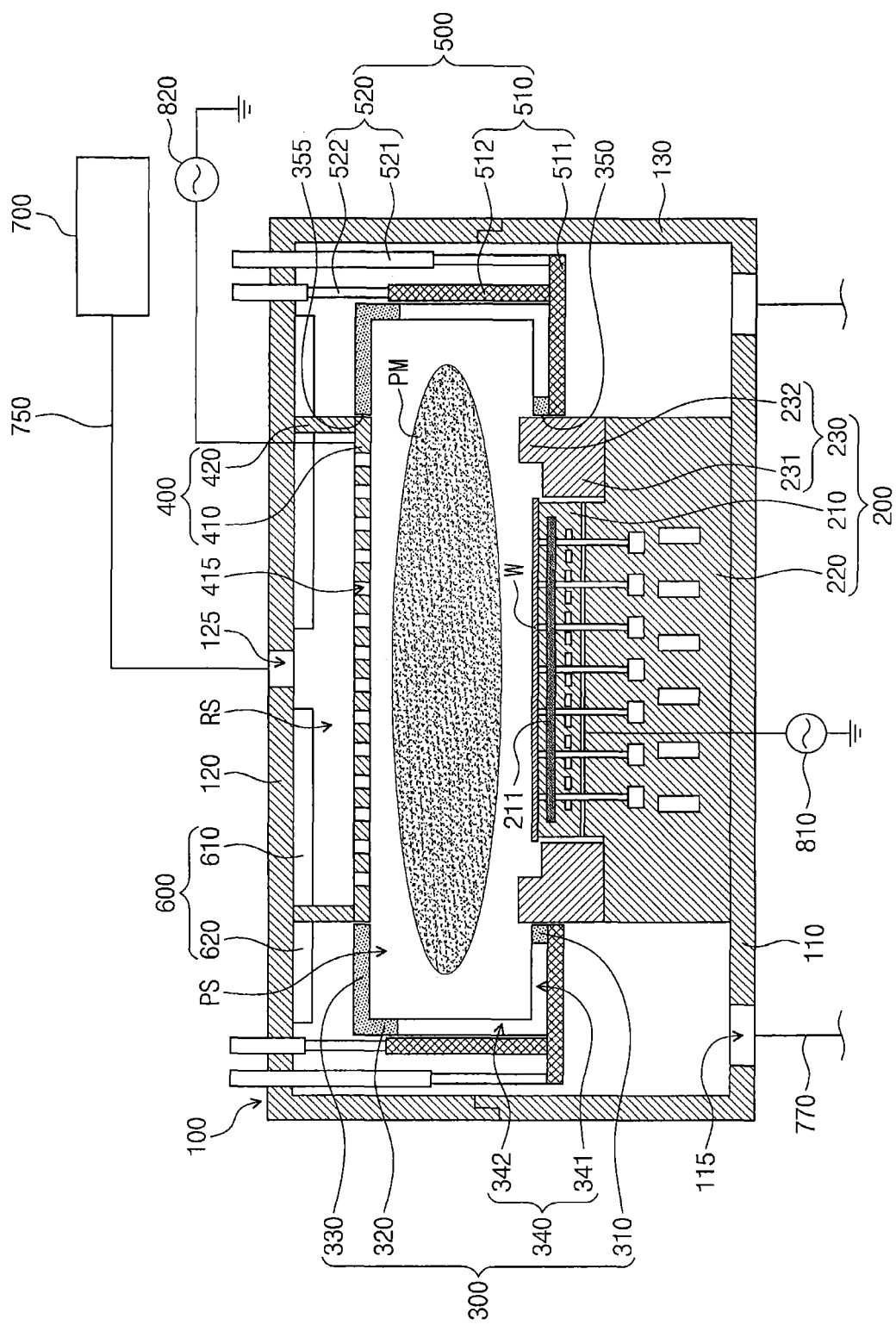
Figure 12C:
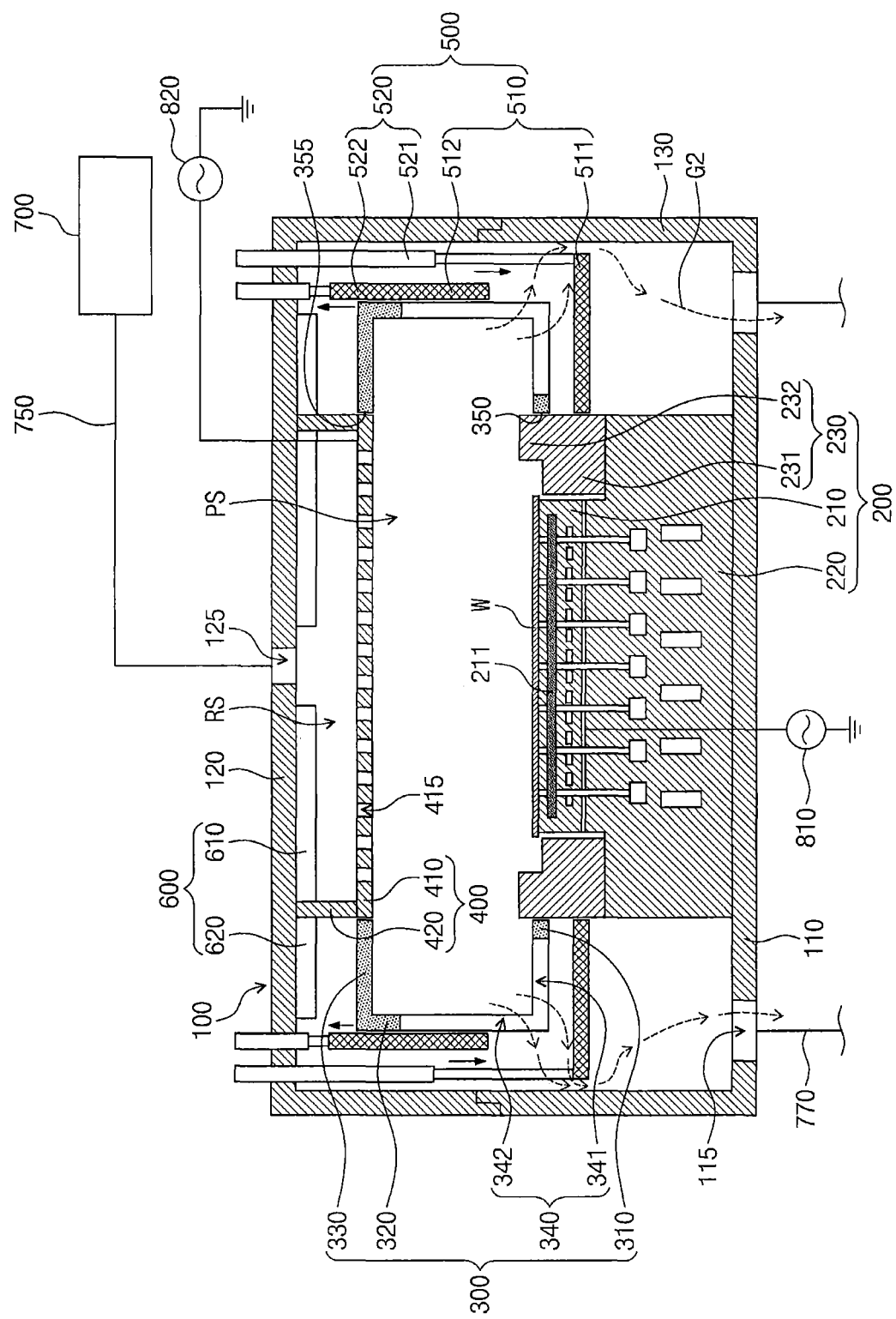

FIGS. 12A to 12C illustrate a process of treating a substrate using the substrate treating system of FIG. 1.

Referring to FIGS. 1 and 12A, the open/close switching unit 500 may be used to close the opened exhaust holes 340 of the shroud unit 300. For example, the first shielding member 511 may be moved toward the first flange portion 310 by the first driving portion 521. Accordingly, the first slits 341 in the opened state may be closed. Also, the second shielding member 512 may be moved toward the first flange portion 310 and/or the first shielding member 511 by the second driving portion 522. Accordingly, the second slits 342 in the opened state may be closed.

If the exhaust holes 340 are closed, the gas supplying unit 700 may supply a process gas G1 into the process chamber 100. The process gas G1 may be contained in the receiving space RS of the plasma source unit 400. The process gas G1 in the receiving space RS may be heated by the heating unit 600. The process gas G1 in the receiving space RS may be injected into the processing space PS of the shroud unit 300 through the injection holes 415 of the upper electrode member 410.

Referring to FIGS. 1 and 12B, the second power 820 may apply a RF power to the upper electrode member 410. Accordingly, the process gas G1 in the processing space PS (e.g., see FIG. 1) may be excited into a plasma state. In other words, plasma PM may be produced in the processing space PS. The first power 810 may apply a first RF power to the supporting unit 200. Accordingly, ions in the plasma PM may be moved toward the substrate W on the supporting unit 200 and may be used to etch the substrate W. In other words, an etching process may be performed on the substrate W.

Referring to FIGS. 1 and 12C, if the etching process on the substrate W is finished, the open/close switching unit 500 may be used to open the exhaust holes 340 of the shroud unit 300. For example, the first shielding member 511 may be downwardly moved by the first driving portion 521. Accordingly, the first slits 341 may be opened. The second shielding member 512 may be upwardly moved by the second driving portion 522. Accordingly, the second slits 342 may be opened.

A remaining gas G2 in the processing space PS may be quickly exhausted through the opened first and second slits 341 and 342. Accordingly, an internal pressure of the shroud unit 300 may be quickly lowered.

The remaining gas G2 exhausted from the shroud unit 300 may be exhausted to the outside of the process chamber 100 through the exhausting hole 115. The remaining gas G2 may include by-products.

According to some embodiments of the inventive concept, it may be possible to quickly exhaust by-products from an internal space of a shroud unit. Accordingly, it may be possible to increase conductance of plasma produced in the shroud unit.

The above-disclosed subject matter is to be considered illustrative, and not restrictive, and the appended claims are intended to cover all such modifications, enhancements, and other embodiments, which fall within the true spirit and scope of the present inventive concept. Thus, to the maximum extent allowed by law, the scope is to be determined by the broadest permissible interpretation of the following claims and their equivalents, and shall not be restricted or limited by the foregoing detailed description.

What is claimed is:

1. A substrate treating system comprising:
a process chamber;
a supporter that is in the process chamber and is configured to support a substrate;
a plasma source that is in the process chamber above the supporter and is configured to produce plasma in the process chamber using a process gas, the plasma source being spaced apart from the supporter in a vertical direction;
a shroud that is in the process chamber between the supporter and the plasma source, the shroud being configured to contain the plasma therein,
wherein the shroud comprises:
a sidewall portion facing a sidewall of the process chamber; and
a first flange portion extending horizontally and radially inward from the sidewall portion and comprising a plurality of first slits that extend radially inward from the sidewall portion and through a thickness of the first flange portion, each of the plurality of first slits having an open end at the sidewall portion and an opposite closed end, the first flange portion defining a first opening, and a portion of the supporter extending through the first opening,
wherein the sidewall portion comprises a plurality of second slits, and each of the plurality of second slits extends through a thickness of the sidewall portion and has an open end and an opposite closed end, and wherein the open end of each of the plurality of second slits in the sidewall portion connects to, and extends generally perpendicularly from the open end of one of the plurality of first slits in the first flange portion toward the plasma source;
a first shielding member having a ring shape, the first shielding member being positioned below the first flange portion of the shroud; and
a first driving member configured to move the first shielding member in the vertical direction to move the first shielding member toward or away from the first flange portion such that the first shielding member closes or opens the plurality of first slits, the first driving member including a pneumatic/hydraulic cylinder.

2. The substrate treating system of claim 1, wherein each of the plurality of second slits extends longitudinally in the vertical direction.

3. The substrate treating system of claim 1, wherein each of the plurality of first slits extends from an outer side surface of the first flange portion toward an inner side surface of the first flange portion.

4. The substrate treating system of claim 1, wherein a first width of each of the plurality of first slits is substantially equal to a second width of each of the plurality of second slits.

5. The substrate treating system of claim 1, wherein the plurality of first slits are arranged along a circumference of the supporter.

6. The substrate treating system of claim 1 further comprising a second shielding member having a cylinder shape, the second shielding member being positioned between the sidewall portion of the shroud and the sidewall of the process chamber; and
a second driving member configured to move the second shielding member in the vertical direction to move the second shielding member toward or away from the first flange portion such that the second shielding member closes or opens the plurality of second slits, the second driving member including a pneumatic/hydraulic cylinder.

7. The substrate treating system of claim 1, further comprising a sealing member that is positioned above the plurality of second slits and is configured to seal a space between the sidewall portion of the shroud and the sidewall of the process chamber, the sealing member formed of or including quartz and/or silicon oxide.

8. The substrate treating system of claim 1, wherein the plasma source comprises an upper electrode that is configured to be connected to an electric power from an outside and to excite the process gas into a plasma state in the process chamber using the electric power.

9. The substrate treating system of claim 8, wherein the shroud further comprises a second flange portion that extends horizontally from the sidewall portion of the shroud, and
wherein the second flange portion is spaced apart from the first flange portion in the vertical direction and defines a second opening, and a portion of the upper electrode extends through the second opening of the second flange portion.

10. The substrate treating system of claim 9, wherein a lower surface of the second flange portion of the shroud is higher in the vertical direction than an upper surface of the supporter.

11. The substrate treating system of claim 1, wherein the first shielding member comprises quartz and/or silicon oxide.

12. A substrate treating system using plasma, the substrate treating system comprising:
a process chamber comprising a bottom wall, a top wall that is spaced apart from the bottom wall in a vertical direction, and a sidewall connected to the bottom wall and the top wall;
an upper electrode that is in the process chamber and is spaced apart from the top wall of the process chamber creating a receiving space for a process gas therebetween;

a heating unit that is in the process chamber and contacts the top wall of the process chamber, the heating unit being spaced apart from the upper electrode and configured to heat the process gas within the receiving space to produce plasma, the heating unit being ring-shaped; and a shroud that is in the process chamber and is configured to contain the plasma therein, wherein the shroud comprises:

a sidewall portion facing the sidewall of the process chamber and having a cylinder shape;

a first flange portion extending horizontally and radially inward from the sidewall portion of the shroud and facing the bottom wall of the process chamber; and a plurality of exhaust holes, each of the plurality of exhaust holes extending continuously from the sidewall portion to the first flange portion, wherein each of the plurality of exhaust holes comprises:

a first slit extending through a thickness of the first flange portion of the shroud, and having an open end at the sidewall portion, and an opposite closed end; and a second slit having an open end and an opposite closed end, and extending perpendicularly through a thickness of the sidewall portion of the shroud, the open end of the second slit being connected to the open end of the first slit, and wherein the first flange portion defines an opening, and the first slits of the plurality of exhaust holes are arranged along a circumference of the opening of the first flange portion.

13. The substrate treating system of claim 12, wherein each of the plurality of exhaust holes is substantially L-shaped.

14. The substrate treating system of claim 12, wherein each of the plurality of exhaust holes comprises:

a first slit extending through a thickness of the first flange portion of the shroud; and a second slit extending through a thickness of the sidewall portion of the shroud and being connected to the first slit, and wherein the first flange portion defines an opening, and the first slits of the plurality of exhaust holes are arranged along a circumference of the opening of the first flange portion.

15. The substrate treating system of claim 12, wherein each of the second slits of the plurality of exhaust holes has a rectangular shape extending longitudinally, in the vertical direction.

16. The substrate treating system of claim 15, wherein the second slits of the plurality of exhaust holes are spaced apart from each other by a uniform distance.

17. The substrate treating system of claim 15, further comprising an open/close switch configured to open or close the plurality of exhaust holes, wherein the open/close switch comprises:

a first shielding member having a ring shape, the first shielding member being positioned below the first flange portion and overlapped by the first flange portion;

a second shielding member having a cylinder shape and being between the sidewall portion of the shroud and the sidewall of the process chamber;

a first driving member configured to move the first shielding member toward or away from the first flange portion, the first driving member including a pneumatic/hydraulic cylinder; and a second driving member configured to move the second shielding member toward or away from the first flange portion, the second driving member including a pneumatic/hydraulic cylinder.

18. A shroud configured to provide a space for plasma in a process chamber, the shroud comprising:

a sidewall portion having a cylinder shape; and a first flange portion having a ring shape, the first flange portion extending horizontally and radially inward from the sidewall portion, wherein the sidewall portion comprises opposing ends that are spaced apart from each other in a vertical direction, and the first flange portion extends from a lower end of the opposing ends of the sidewall portion, wherein the first flange portion comprises a plurality of first slits, and each of the plurality of first slits extends through a thickness of the first flange portion and extends radially inward from the sidewall portion, each of the plurality of first slits having an open end at the sidewall portion and an opposite closed end, and wherein the sidewall portion comprises a plurality of second slits, and each of the plurality of second slits extends through a thickness of the sidewall portion and has an open end and an opposite closed end, and wherein the open end of each of the plurality of second slits in the sidewall portion connects to, and extends longitudinally, generally perpendicularly from the open end of one of the plurality of first slits in the first flange portion toward an upper end of the opposing ends of the sidewall portion.

19. The shroud of claim 18, wherein each of the plurality of second slits extends longitudinally in the vertical direction.

20. The shroud of claim 18, further comprising a second flange portion having a ring shape and extending from the sidewall portion, wherein the second flange portion is adjacent the upper end of the opposing ends of the sidewall portion.

* * * * *